United States Patent [19]

Kim et al.

[11] Patent Number: 5,324,679
[45] Date of Patent: Jun. 28, 1994

[54] METHOD FOR MANUFACTURING A SEMICONDUCTOR DEVICE HAVING INCREASED SURFACE AREA CONDUCTIVE LAYER

[75] Inventors: Sung-tae Kim; Kyung-hoon Kim; Jae-hong Ko, all of Seoul, Rep. of Korea

[73] Assignee: Samsung Electronics Co., Ltd., Kyunggi-do, Rep. of Korea

[21] Appl. No.: 843,451

[22] Filed: Feb. 28, 1992

[30] Foreign Application Priority Data

Mar. 23, 1991 [KR] Rep. of Korea .................. 91-4639

[51] Int. Cl.$^5$ .................. H01L 21/70; H01L 27/00
[52] U.S. Cl. .................. 437/52; 437/60; 437/919
[58] Field of Search .................. 437/47, 52, 60, 919, 437/228; 156/643; 257/299-312

[56] References Cited

U.S. PATENT DOCUMENTS

| | | |
|---|---|---|
| 3,856,587 | 12/1974 | Yamazaki et al. . |
| 4,578,142 | 3/1986 | Corboy, Jr. et al. . |
| 4,698,316 | 10/1987 | Corboy, Jr. et al. . |
| 4,906,590 | 3/1990 | Kanetaki et al. .................. 437/229 |
| 5,043,780 | 8/1991 | Fazan et al. .................. 357/23.6 |
| 5,068,199 | 11/1991 | Sandhu . |
| 5,112,773 | 5/1992 | Tuttle . |
| 5,149,676 | 9/1992 | Kim et al. .................. 437/228 |

FOREIGN PATENT DOCUMENTS 1-42161  2/1989  Japan .................. 437/919

OTHER PUBLICATIONS

Mine et al. "Capacitance-Enhanced Stacked-Capacitor with Engraved Storage Electrode for Deep Submicron DRAMs" Hitachi VLSI Engineering Corp., Tokyo Japan, pp. 137-140, 1989, month unknown.

Fazan et al. "Electrical Characterization of Textured Interpoly capacitors for Advanced Stacked DRAMs" IEDM Technical Digest, 1990, month unknown.

H. Watanabe, et al., "A New Stacked Capacitor Structure Using Hemispherical-Grain (HSG) Poly-Silicon Electrodes"; Extended Abstracts of the 22nd (1990 Int'l) Conference on Solid State Devices and Materials, Sendai, 1990, pp. 873-876, month unknown.

Yoshio Hayashide et al., "Fabrication of Storage Capacitance-Enhanced Capacitors With a Rough Electrode"; Extended Abstracts of the 22nd (1990 Int'l) Conference on Solid State Devices and Materials, Sendai, 1990, pp. 869-872, month unknown.

Primary Examiner—Olik Chaudhuri
Assistant Examiner—H. Jey Tsai
Attorney, Agent, or Firm—Morgan & Finnegan

[57] ABSTRACT

A semiconductor device having a capacitor of large capacitance and the fabrication method thereof are disclosed. The semiconductor device comprises; a first electrode composed of a conductive structure whose entire surface, including sidewalls, are uneven and formed on the semiconductor substrate; a second electrode formed on the first electrode; and a dielectric film formed between the first and second electrodes. Also the method comprises the steps of forming as a first electrode a conductive structure with an uneven surface on a semiconductor structure, forming a dielectric film, and forming a conductive layer as a second electrode on the conductive structure. Accordingly, a capacitor of large capacitance and high reliability can be obtained.

18 Claims, 5 Drawing Sheets

METHOD FOR MANUFACTURING A SEMICONDUCTOR DEVICE HAVING INCREASED SURFACE AREA CONDUCTIVE LAYER

BACKGROUND OF THE INVENTION

The present invention relates to a semiconductor device having a capacitor and a method for manufacturing the same, and more particularly to a semiconductor device having a capacitor of large capacitance and a method for manufacturing the same.

One type of memory device formed on the semiconductor substrate is the dynamic RAM (hereinafter referred to as DRAM) composed of a MOS transistor and a MOS capacitor. In the above DRAM, data is stored according to whether or not the MOS capacitor is charged. Also, data is read out by discharging the MOS capacitor to a bit line through the MOS transistor and then detecting the change in its potential.

Recently, miniaturization and large-scaled integration of DRAMs have advanced in accordance with the progress of semiconductor technology. A major problem in the large scaled integration of DRAM is how to increase cell capacitance while reducing memory cell size.

It is known that the capacitance of a capacitor is directly proportional to the dielectric constant and the surface area of the dielectric film, and inversely proportional to the thickness of the dielectric film. Therefore, in order to increase the capacitance, it is necessary to use an insulation layer with a larger dielectric constant, enlarge the surface area of the dielectric film, or make the dielectric film thinner. However, it is undesirable to reduce the thickness of the dielectric film to increase the capacitance, because this decreases the reliability of the semiconductor device. Additionally, it has been suggested to use as a dielectric film an insulating layer with large dielectic constant such as a $Ta_2O_5$ film, but this is not yet practically in use. Accordingly, it is desirable to enlarge the effective surface area of the capacitor in order to increase its capacitance. A great deal of research has been carried out and various methods for increasing the effective area of a capacitor have been suggested, for example, a capacitor having a trench structure obtained by forming its storage electrode on an etched trench in the semiconductor substrate.

Recently, a method for producing a larger capacitance in a semiconductor memory device without enlarging the area of the cell nor heightening the storage electrode was suggested and is drawing great attention. That is, the technology for forming a polycrystalline silicon layer with an uneven surface as a storage electrode having an enlarged surface area due to this unevenness is disclosed in the 1990 Extended Abstracts of the 22nd Conference on Solid State Device and Materials, pp. 869 to 872 (Yoshio Hayashide et al.) and pp. 873 to 876 (H. Watanabe et al.).

FIG. 1 illustrates a sectional view of a stacked capacitor having uneven surface of the electrode described in the above papers. According to the method of Watanabe et al., after growing a field oxide 2 on a silicon substrate 1 by an LOCOS method, a first impurity-doped polycrystalline silicon layer as a gate electrode 3 is formed and then a source region 4 and a drain region 5 are formed by ion implantion. Then, an oxide layer 6 as an insulation layer is formed. Thereafter, to form a storage electrode 7 as the capacitor's first electrode, polycrystalline silicon is deposited by an LPCVD method at 550° C. to form a first polycrystalline film. The specific temperature, 550° C., corresponds to the transition temperature of the film structure, from amorphos to polycrystalline. The surface area of a polycrystalline silicon film deposited at this is about twice as large as that deposited at different temperatures.

Thereafter, a photoresist (not shown in FIG. 1) is coated on the first polycrystalline silicon film and is exposed and developed using a mask, thereby forming a photoresist pattern. Subsequently, storage electrode 7 is formed by ething the first polycrystalline silicone film using the photoresist pattern as·an etching mask and then removing the photoresist pattern. Thereafter, a dielectric film 8 composed of oxide/nitride is formed on the thus-obtained storage electrode 7. A second electrode 9 as a plate electrode of the capacitor is formed by depositing polycrystalline silicon on dielectric film 8 to form a second polycrystalline silicon film.

According to the above method, twice the capacitance can be obtained by applying the above-mentioned polycrystalline silicon film to the storage electrode for a stacked capacitor.

Also, Hayashide et al. teach that a capacitor attains 1.5 times as much capacitance as one with a conventional polycrystalline silicon electrode, when the storage electrode is formed by depositing polycrystalline silicon at 575° C.

However, when manufacturing a capacitor by this method, critical temperature adjustment is necessary when depositing the polycrystalline silicon. Also, the thickness of the polycrystalline silicon film as the storage electrode of the capacitor is an important factor in controlling the surface unevenness. Therefore, it is difficult to obtain various capacitor structures. Moreover, since after the depositing process, the uneven surface of the sidewall thereof is removed since the deposited polycrystalline silicon film is patterned by photolithography and an etching process, thereby reducing the effect of the enlargement of the capacitor's effective surface area. To overcome these problems, the present inventors have conducted many experiments, as a result, have accomplished the present invention.

SUMMARY OF THE INVENTION

It is an object of the present invention to provide a semiconductor device having a capacitor of large capacitance and of various form, independent from the thickness of the capacitor's lower electrode, and the fabrication method thereof.

According to the present invention, there is provided a semiconductor device including a capacitor which comprises;

a first electrode whose entire surface, including sidewall surfaces, are uneven and formed on the semiconductor substrate;

a second electrode formed on the first electrode; and a dielectric film formed between the first and second electrodes.

According to the present invention, there is provided a method for manufacturing a semiconductor device which comprises the steps of forming a conductive structure with an uneven surface on a semiconductor substrate as a first electrode and forming a dielectric film and a conductive layer as a second electrode on the conductive structure.

According to one embodiment of the present invention, the conductive structure may be composed of polycrystalline silicon. The above uneven conductive structure may be formed by forming a polycrystalline silicon pattern on a semiconductor substrate, forming an insulation film having pin holes on the surface of the polycrystalline silicon pattern, etching the polycrystalline silicon pattern through the pin holes and then removing the insulation film. The above polycrystalline silicon pattern, for example, may be obtained by depositing the polycrystalline silicon on the semiconductor substrate to form a polycrystalline silicon layer, implanting an impurity into the polycrystalline silicon layer, and then forming a predesignated pattern via a conventional photolithography process. The above-mentioned polycrystalline silicon may typically be deposited by thermally decomposing silane ($SiH_4$) in the temperature range of from 580° C. to 650° C. It is preferable to deposit polycrystalline silicon by means of LPCVD, in view of its uniformity, purity, and economy. After depositing the polycrystalline silicon to form a polycrystalline silicon layer, a photoresist is coated on the polycrystalline silicon layer and then a photoresist pattern is formed by conventional photolithography process. Thereafter, a polycrystalline silicon pattern is formed by a anisotropically etching the polycrystalline silicon layer using the photoresist pattern as an etching mask, and then removing the photoresist pattern.

The above polycrystalline silicon pattern may be formed on the inner surface of a trench formed in the semiconductor substrate.

According to another embodiment of the present invention, the above-mentioned conductive structure may be a portion of the single crystalline silicon substrate itself. For example, a trench is formed in the silicon substrate and then conductivity is imparted to the inner surface of the trench by implanting an impurity. Thereafter, an insulation film having pin holes is formed on the inner surface of the trench in the semiconductor substrate. The inner surface of the trench is then etched through the pin holes. Then, the insulation film is removed to obtain a trench with an uneven inner surface. The inner surface portion of the trench may be used as a conductive structure of the present invention.

The insulation film having pin holes is formed on the conductive structure as described above. Preferably, the insulation film is a silicon nitride film formed by depositing silicon nitride. It is known that the silicon nitride film has pin holes. In the present invention, it is preferable to adjust the deposition condition in order to make the density of the pin holes appropriate. For example, the silicon nitride film is formed by an LPCVD method using a $SiCl_2H_2+NH_3$ system in the temperature range of 700° C.-800° C. Preferably the deposited silicon nitride film has a thickness of 30 Å-500 Å.

If the silicon nitride is deposited too thick or the density of the pin holes is too low, the surface of the conductive structure with a silicon nitride film formed thereon is preferably oxidized, and if so, the density of the pin holes of the silicon nitride increases as silicon oxide is formed. That is, new pin holes or cracks are created in the silicon nitride film according to the consumption of silicon nitride during the oxidation process. This phenomenon appears remarkably in a case that polycrystalline silicon is used for forming the conductive structure.

It is preferable that the oxidation condition is varied in accordance with the thickness or the deposition condition of the deposited silicon nitride so that the silicon nitride film has a predesignated pin hole density. The thinner the thickness of the silicon nitride film is, oxidation is carried out at a lower temperature and within a shorter period. The oxidation, preferably, is carried out in the temperature range of 800° C.-950° C. for 20-40 minutes under the presence of $H_2O$. The silicon oxide formed by the oxidation is removed by a wet etching method using an HF or buffered HF mixture ($NH_4F:HF=6:1$).

The conductive structure is etched through pin holes formed in the insulation film using the insulation film as a mask. To make the surface of the conductive structure uneven, the conductive structure is anisotropically or isotropically etched through the pin holes formed in the insulation layer using an etchant. Here, the depth of the etched portions is preferably 20 Å-500 Å.

After etching the conductive structure, the insulation film is removed by wet etching.

According to yet another embodiment of the present invention, after the insulation film is removed, impurity-implanted polycrystalline silicon may be deposited on the uneven surface of the conductive structure. The unevenness of the surface of the conductive structure can be controlled by the depositing of the impurity-implanted polycrystalline silicon. Moreover, the electric field concentration phenomenon in the sharply protruding parts of the uneven surface can be avoided since the sharp protrusions become blunt by deposition of the impurity-implanted polycrystalline silicon. The impurity-implanted polycrystalline silicon is preferably deposited to a thickness of 50 Å-500 Å.

According to still another embodiment of the present invention, the conductive structure may be formed by forming a polycrystalline silicon pattern on the semiconductor substrate, forming an insulation film having pin holes on the polycrystalline silicon pattern, etching the polycrystalline silicon pattern through the pin holes, removing the insulation film and then imparting conductivity thereinto by implanting an impurity.

After forming the conductive structure, a dielectric film and a second electrode composed of conductive material are formed on the conductive structure. Examples of a dielectric film which can be used in the present invention are: $Ta_2O_3$ film, NO film, ONO film, $SiO_2$ film $Si_3N_4$ film, etc. The second electrode is formed, for example, using polycrystalline silicon, which is deposited on the dielectric film and then conductivity is imparted therein.

BRIEF DESCRIPTION OF THE DRAWINGS

The above object and other advantages of the present invention will become more apparent by describing the preferred embodiments of the present invention with reference to the attached drawings, in which.

DETAILED DESCRIPTION OF THE INVENTION

Figure 1:
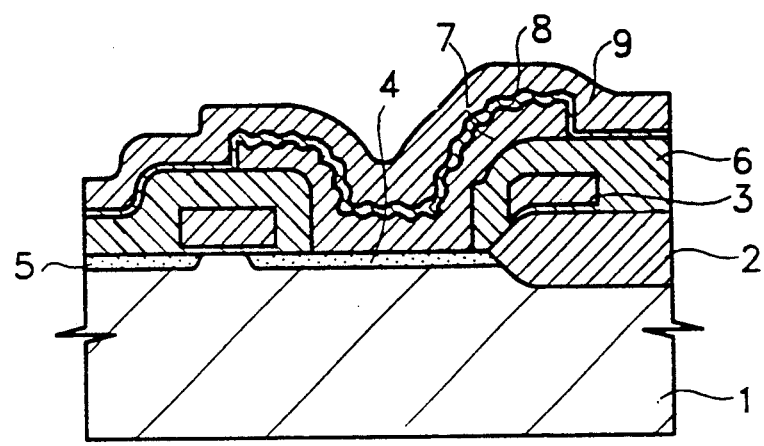
FIG. 1 is a sectional view of a semiconductor device having a stacked capacitor structure with an uneven surface manufactured by a conventional method.
Figure 2:
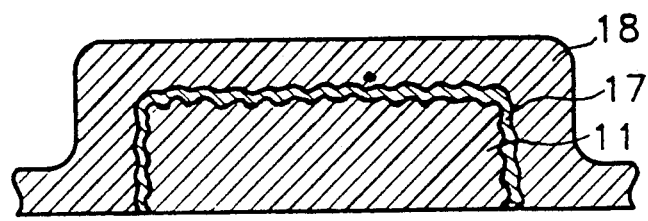
FIG. 2 is a sectional view of a capacitor manufactured by the present invention.

FIG. 2 is a sectional view showing a capacitor part of a semiconductor device according to the present invention. In FIG. 2, reference numeral 11 designates a conductive structure, 17 designates a dielectric film and 18 designates a second electrode.

The conductive structure may be composed of impurity-implanted polycrystalline silicon or single crystalline silicon. The conductive structure is preferably formed by depositing polycrystalline silicon to form a polycrystalline silicon layer, implanting an impurity thereinto and then patterning it.

The upper and sidewall surfaces of the conductive structure are uneven; the degree of unevenness being 20 Å–500 Å. Owing to this unevenness, the conductive structure, i.e., the storage electrode of a capacitor, has an enlarged surface area, thereby increasing its capacitance.

The type of the above-mentioned dielectric film is not limited as long as it is a conventional insulation film which is applicable to the capacitor of the semiconductor device. Examples of the above dielectric film are: $Ta_2O_3$ film, $SiO_2$ film, $Si_3N_4$ film, NO($Si_3N_4/SiO_2$) film, ONO ($SiO_2/Si_3N_4/SiO_2$) film, etc.

The second electrode may be composed of any conductive material applicable to a plate electrode. Preferably, the second electrode is composed of polycrystalline silicon.

FIGS. 3A through 3E show semiconductor devices having capacitors of large capacitance according to the present invention.

Figure 3A:
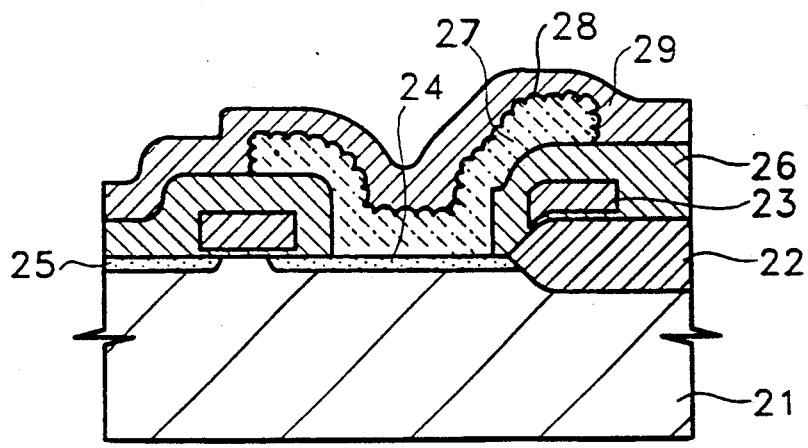
FIGS. 3A through 3E are sectional views of semiconductor devices having capacitors as various embodiments of the present invention.
Figure 3B:
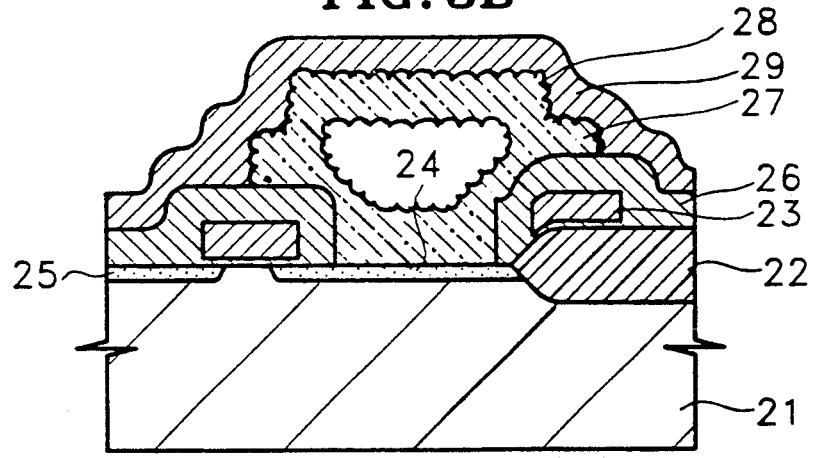
Figure 3C:
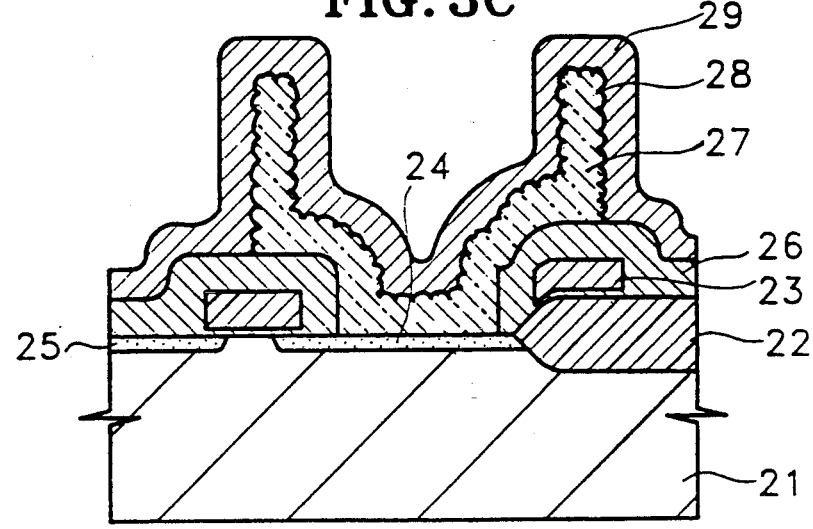
Figure 3D:
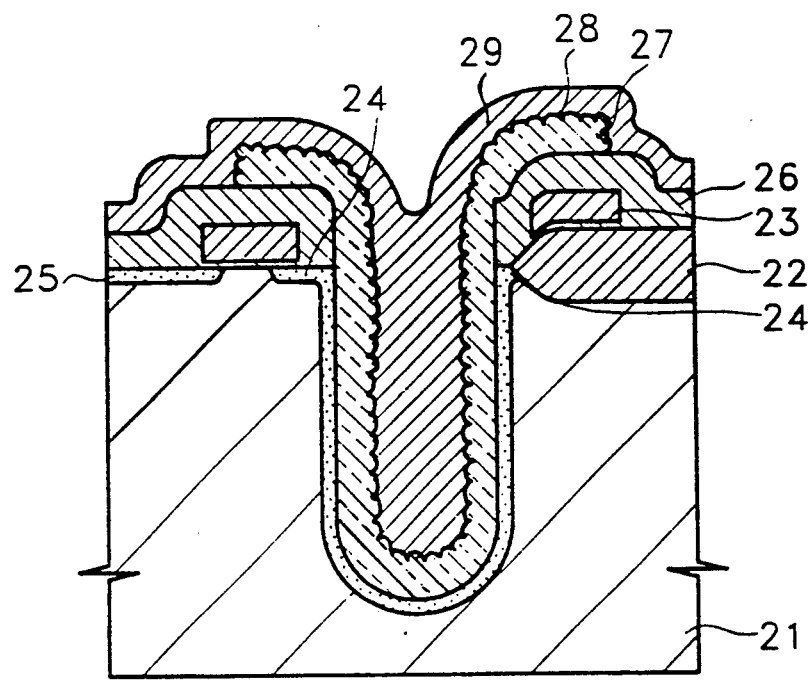
Figure 3E:
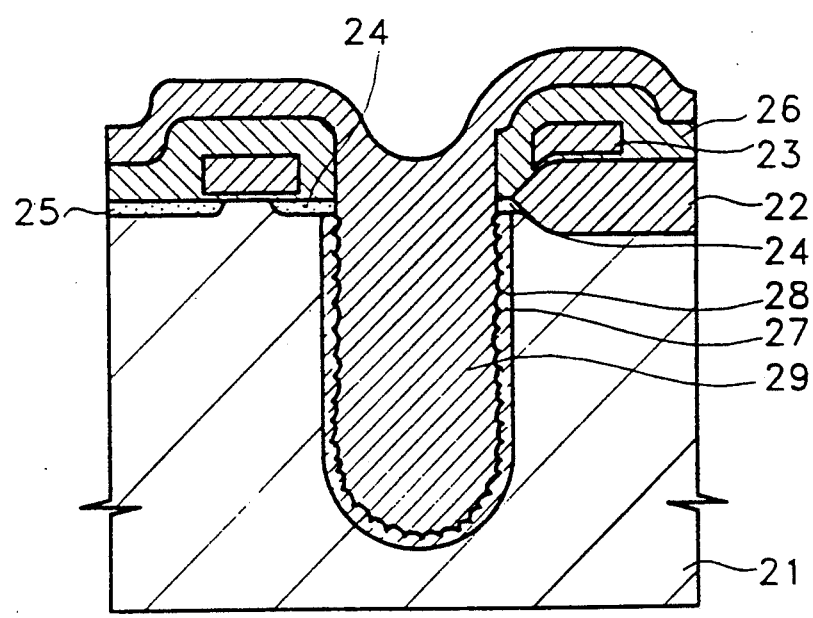

FIG. 3A is a sectional view showing a semiconductor device with stacked capacitor structure, FIG. 3B is a sectional view showing a semiconductor device with hallow type capacitor structure, FIG. 3C is a sectional view showing a semiconductor device with cylindrical capacitor structure, FIG. 3D is a sectional view showing a semiconductor device with stack-trench type capacitor structure, and FIG. 3E is a sectional view showing a semiconductor device with trench type capacitor structure. In FIGS. 3A through 3E, reference numeral 21 designates a silicon substrate, 22 designates a selectively grown field oxide film, 23 designates a gate electrode, 24 and 25 designate a source region and a drain region, respectively, 26 designates an insulation film, 27 designates a first electrode with an uneven surface and composed of polycrystalline silicon, 28 designates a dielectric film and 29 designates a second electrode. FIGS. 3A through 3C illustrate semiconductor devices of which the conductive structures as the first electrodes of capacitors are composed of polycrystalline silicon, while FIG. 3D illustrates a semiconductor device of which the conductive structure as the first electrode of a capacitor composed of polycrystalline silicon is formed on the inner surface of a trench formed in the semiconductor substrate, and FIG. 3E illustrates a semiconductor device including the first electrode of a capacitor obtained by forming a trench on the impurity-implanted silicon substrate, forming an insulation layer having pin holes on the inner surface of the trench, etching the silicon substrate through the pin holes, and then removing the insulation film.

Generally, a semiconductor device by the present invention may be any semiconductor device having capacitors such as in a DRAM chip.

The method of the present invention will be described below in great detail by embodiments. However, it should be appreciated that the present invention provides widely applicable inventive concepts, which can be embodied in a tremendous variety of specific contexts. The specific embodiments discussed are merely illustrative of specific ways to make and use the invention, and do not limit the scope of the invention.

FIGS. 4A through 4H illustrate an embodiment of the method for manufacturing a capacitor included in a semiconductor device according to the present invention.

Figure 4A:
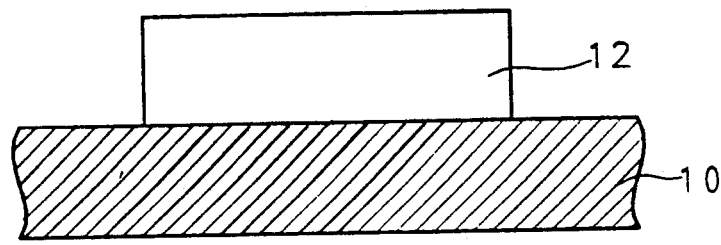
FIGS. 4A through 4H are sectional views showing the sequential fabrication process of a capacitor of the semiconductor device according to the present invention.

FIG. 4A illustrates a step of forming a polycrystalline silicon pattern 11 on the semiconductor substrate. The polycrystalline silicon is deposited on the semiconductor substrate by an LPCVD method to form a polycrystalline silicon layer 10 and then impurities are implanted therein. Thereafter, the photoresist is coated on the surface of the polycrystalline silicon layer 10 and a photoresist pattern 12 is formed by exposing and developing using a mask (not shown).

Figure 4B:
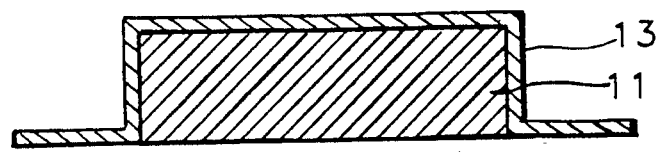

FIG. 4B illustrates a polycrystalline silicon pattern 11 on which a silicon nitride film 13 is coated. The polycrystalline silicon pattern 11 is formed by anisotropically etching polycrystalline silicon layer 10 using photoresist pattern 12 as an etching mask. Then, to form silicon nitride film 13, silicon nitride is deposited to a thickness of 50 Å on polycrystalline silicon pattern 11 by an LPCVD method using a $NH_3 + SiH_2Cl_2$ system at a temperature of about 790° C.

Figure 4C:
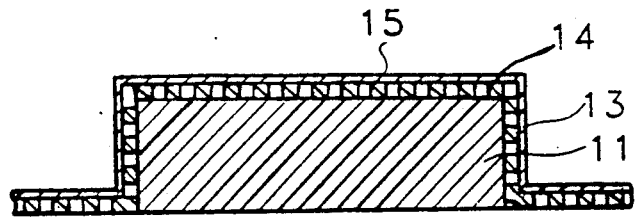

FIG. 4C illustrates a step of forming a silicon oxide film 15 on silicon nitride film 13 by oxidation of polycrystalline silicon pattern 11 on which silicon nitride film 13 is formed. If, after the formation of silicon nitride film 13, silicon oxide film 15 is formed by thermally treating the surface of silicon nitride 13 at a temperature range of 850° C.–950° C. under the presence of $H_2O$ to oxidize the surface of the polycrystalline silicon pattern 11, the size of pin holes 14 of the silicon nitride film 13 increases as described in FIG. 4C. Further, new pin holes are then created or silicon nitride film 13 is partially cracked according to the consumption of the nitride film during the oxidation process.

Figure 4D:
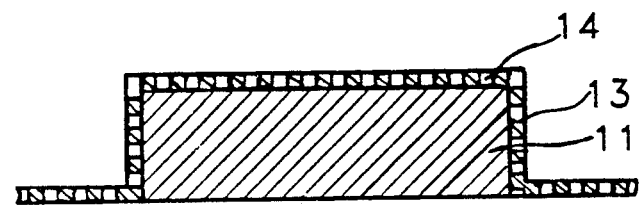

FIG. 4D illustrates a step of removing silicon oxide film 15. The silicon oxide film 15 formed on silicon nitride film 13 during the oxidation process, is removed by wet etching method using an HF or buffered HF mixture.

Figure 4E:
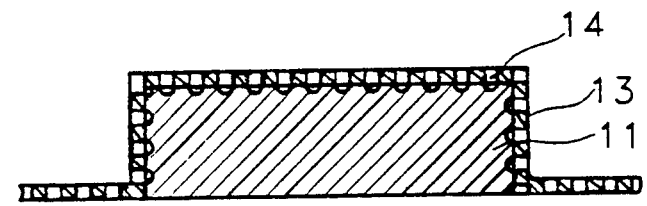

FIG. 4E illustrates a step of selectively etching polycrystalline silicon pattern 11. The polycrystalline silicon pattern 11 is etched by anisotropically or isotropically etching through the enlarged pin holes of silicon nitride film 13 using a silicon etchant. At this time, the depth of the etched portions is 20 Å–500 Å.

Figure 4F:
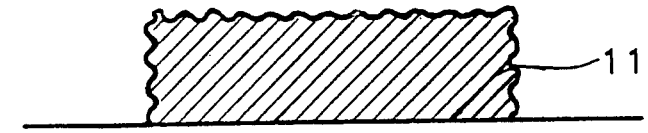

FIG. 4F illustrates a step of removing silicon nitride film 13 by wet etching.

Figure 4G:
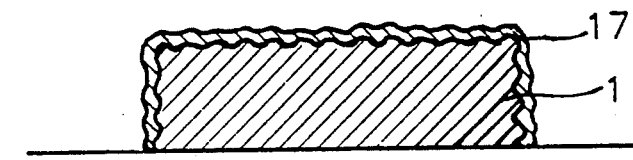

FIG. 4G illustrates a step of forming an ONO film as a dielectric film 17 after the selective etching of polycrystalline silicon pattern 11.

Figure 4H:
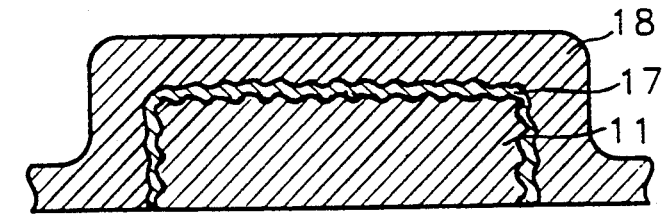

FIG. 4H illustrates a capacitor formed according to the method of the present invention. The capacitor is obtained by forming a second electrode 18 of the capacitor on dielectric film 17 using polycrystalline silicon.

As is obvious above, the capacitance of the capacitor according to the present invention is increased to approximately 1.5 times or more, with its reliability almost the same as a conventional one. Accordingly, the capacitor of the present invention is enough to be applicable to the semiconductor device, e.g., a DRAM, of the next generation.

What is claimed is:

1. A method for manufacturing a semiconductor device, which comprises the steps of:
   forming a conductive structure on a semiconductor substrate;
   depositing silicon nitride on said conductive structure to thereby form a nitride layer having pin holes on said conductive structure;
   forming a silicon oxide film on said nitride layer and in said pinholes;
   etching said silicon oxide film on said nitride layer and in said pinholes;
   etching said conductive structure through said pin holes to thereby give a first electrode of a capacitor; and
   forming a dielectric film and a second electrode of said capacitor on said first electrode.

2. A method for manufacturing a semiconductor device as claimed in claim 1, wherein said conductive structure is composed of polycrystalline silicon.

3. A method for manufacturing a semiconductor device as claimed in claim 2, wherein said conductive structure is a polycrystalline pattern.

4. A method for manufacturing a semiconductor device as claimed in claim 3, wherein said polycrystalline silicon pattern is formed by depositing said polycrystalline silicon on said semiconductor substrate to form a polycrystalline silicon layer, implanting an impurity therein and then performing a conventional photolithorgaphy process.

5. A method for manufacturing a semiconductor device as claimed in claim 1, wherein said conductive structure is a portion of a single crystalline silicon substrate.

6. A method for manufacturing a semiconductor device as claimed in claim 5, wherein said conductive structure is formed by forming a trench in said single crystalline silicon substrate and then imparting conductivity to an inner surface of said trench by implanting an impurity.

7. A method for manufacturing a semiconductor device as claimed in claim 3, wherein said conductive structure is formed on the inner surface of a trench formed in said semiconductor substrate.

8. A method for manufacturing a semiconductor device as claimed in claim 3, wherein silicon nitride is deposited to a thickness of 30 Å to 500 Å by an LPCVD method to form a silicon nitride film.

9. A method for manufacturing a semiconductor device as claimed in claim 3, wherein the surface of said conductive structure with said silicon nitride film formed thereon is oxidized to form said silicon oxide film.

10. A method for manufacturing a semiconductor device as claimed in claim 9, said silicon oxide formed on said silicon nitride film is removed selectively.

11. A method for manufacturing a semiconductor device as claimed in claim 10, wherein said silicon oxide film is selectively removed by wet etching using an HF or buffered HF mixture.

12. A method for manufacturing a semiconductor device as claimed in claim 3, wherein said conductive structure is etched by anisotropic or isotropic etching.

13. A method for manufacturing a semiconductor device as claimed in claim 12, wherein said conductive structure is etched to a depth of 20 Å to 500 Å.

14. A method for manufacturing a semiconductor device, which comprises the steps of:
   depositing polycrystalline silicon on a semiconductor substrate;
   forming a polycrystalline pattern;
   forming an insulation layer having pin holes on said polycrystalline pattern;
   etching said polycrystalline pattern through said pin holes;
   removing said insulating layer;
   imparting conductivity to said polycrystalline silicon pattern by implanting an impurity to thereby form a first electrode of a capacitor with an uneven surface; and then
   forming a dielectric film and a second electrode of said capacitor on said first electrode.

15. A method for manufacturing a semiconductor device as claimed in claim 1, wherein said dielectric film is an ONO film.

16. A method for manufacturing a semiconductor device as claimed in claim 1, wherein said second electrode is formed by depositing polycrystalline silicon.

17. A method for manufacturing a semiconductor device as claimed in claim 3, further comprising the step of depositing impurity-implanted polycrystalline silicon on said conductive structure after removing said insulating layer.

18. A method for manufacturing a semiconductor device as claimed in claim 17, wherein said impurity-implanted polycrystalline silicon is deposited to a thickness of 50 Å to 500 Å.

* * * * *